(12) United States Patent
Mercier et al.

(10) Patent No.: US 10,798,309 B2
(45) Date of Patent: Oct. 6, 2020

(54) METHOD AND APPARATUS FOR NONUNIFORMITY CORRECTION OF IR FOCAL PLANES

(71) Applicant: BAE Systems Information and Electronic Systems Integration Inc., Nashua, NH (US)

(72) Inventors: Michael N. Mercier, Nashua, NH (US); Lucas Lawrence-Hurt, Newmarket, NH (US); Joseph M. Schlupf, Newburyport, MA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 18 days.

(21) Appl. No.: 16/197,995

(22) Filed: Nov. 21, 2018

(65) Prior Publication Data
US 2020/0162656 A1    May 21, 2020

(51) Int. Cl.
| | |
|---|---|
| *H01L 31/02* | (2006.01) |
| *H01L 27/146* | (2006.01) |
| *H01L 31/167* | (2006.01) |
| *H04N 5/235* | (2006.01) |
| *H01L 31/0296* | (2006.01) |

(52) U.S. Cl.
CPC ..... *H04N 5/2354* (2013.01); *H01L 27/14649* (2013.01); *H01L 31/02966* (2013.01); *H01L 31/167* (2013.01); *H04N 5/2351* (2013.01)

(58) Field of Classification Search
None
See application file for complete search history.

(56) References Cited

U.S. PATENT DOCUMENTS

| | | | |
|---|---|---|---|
| 7,294,817 B2 | 11/2007 | Voigt et al. | |
| 7,542,090 B1 | 6/2009 | Merchant | |
| 8,428,385 B2 | 4/2013 | Whiteside et al. | |
| 8,872,111 B2 | 10/2014 | Burkland | |
| 9,602,744 B2 | 3/2017 | Hall et al. | |
| 9,900,517 B2* | 2/2018 | Hansen | H04N 5/2258 |
| 2004/0109059 A1* | 6/2004 | Kawakita | H04N 7/18 348/143 |
| 2007/0221849 A1* | 9/2007 | Tabirian | G01S 17/18 250/341.1 |
| 2012/0098971 A1* | 4/2012 | Hansen | H04N 5/33 348/164 |
| 2012/0098972 A1* | 4/2012 | Hansen | H04N 5/23212 348/164 |

(Continued)

OTHER PUBLICATIONS

International Search Report, PCT/US19/62232, 8 pages, dated Jan. 10, 2020.

*Primary Examiner* — Reza Aghevli
(74) *Attorney, Agent, or Firm* — Sand, Sebolt & Wernow LPA; Scott J. Asmus

(57) ABSTRACT

A method and apparatus for calculating and accounting for non-uniformity of pixels within an infrared (IR) focal plane sensor utilizing an infrared light emitting diode (IR LED) to wash out environmental infrared light is provided. The IR LED may back propagate through an optical path of an IR sensor to illuminate pixels on a focal plane array, thereby providing data by which the non-uniformity offsets may be calculated and removed for normal operation of the IR sensor.

20 Claims, 4 Drawing Sheets

(56) References Cited

U.S. PATENT DOCUMENTS

| | | | |
|---|---|---|---|
| 2014/0112537 A1* | 4/2014 | Frank | G01N 21/17 382/103 |
| 2014/0218520 A1* | 8/2014 | Teich | H04N 5/2354 348/143 |
| 2016/0037077 A1* | 2/2016 | Hansen | H04N 5/23212 348/164 |
| 2017/0374261 A1* | 12/2017 | Teich | H04N 5/2257 |

* cited by examiner

METHOD AND APPARATUS FOR NONUNIFORMITY CORRECTION OF IR FOCAL PLANES

TECHNICAL FIELD

The present disclosure relates generally to the field of infrared focal plane sensors. More particularly, in one example, the present disclosure relates to a system and method of calibration of an infrared focal plane sensor. Specifically, in another example, the present disclosure relates to an apparatus and method for calibration of an infrared focal plane sensor utilizing an infrared light emitting diode to correct non-uniformity within the sensor at each power on cycle.

BACKGROUND

Background Information

Infrared (IR) radiation is emitted as infrared light, which falls on the electromagnetic spectrum but is invisible to human eyes. IR radiation, or IR light, is instead felt as heat. IR light waves are longer than those of visible light, extending in the electromagnetic spectrum just beyond the red end, falling between microwaves and visible light. IR light has frequencies ranging from approximately three gigahertz up to about 400 terahertz with wavelengths of approximately 30 centimeters to 740 nanometers, although these values not definitive.

Nearly everything emits IR radiation provided it has a temperature above approximately five degrees Kelvin (approximately equivalent to −450 Fahrenheit or −260 degrees Celsius). Thus, detecting IR radiation is valuable as it can be used to detect people and objects even in low visible light scenarios. For this reason, it is extensively used in military and civilian applications, including target acquisition, surveillance, night vision, homing and tracking. Non-military uses may further include environmental monitoring, safety inspections, temperature sensing, communications, spectroscopy, and weather forecasting.

There are many IR detectors available and in use, each type with its own advantages and limitations. One common detector type utilizes an array made of mercury-cadmium-telluride (MCT). These MCT detectors are the only common detectors that can detect IR radiation in all accessible atmosphere windows, including short-wave infrared (SWIR), mid-wave infrared (MWIR), and long-wave infrared (LWIR). Detection in each of these windows may be obtained using various concentrations of cadmium relative to the mercury and telluride within the MCT detector. Further, MCT detectors have high quantum efficiency and are therefore commonly used in military applications. In particular, many of these detectors are included on aircraft and/or small munitions for its ability to detect IR radiation.

One issue with MCT detectors, or more specifically, with cameras utilizing MCT detectors, is that these cameras tend to have introduced non-uniformity, or offsets, that arise from the power on cycle which can induce errors into the images being produced by the camera. These offsets occur every time a camera utilizing an MCT detector is powered on and the offsets tend to have a different pattern or distribution within the detector at each power on cycle. Thus, these offsets should be compensated for and/or removed from any resulting image to insure the highest accuracy of the detected IR radiation.

Previous attempts to compensate for these offsets include software-based compensation techniques utilizing algorithms and/or processes to determine the offsets and mathematically subtract them out from the image data, and/or physical compensation techniques to identify the offsets so they can then be accounted for and subtracted from the image data. Either of these types of solutions tend to utilize common offset compensation algorithms to ultimately process the image data to remove the offsets.

One common software-based solution involves aggregating the detection data over the course of a relatively long period of time while operating under the assumption that all pixels in the detector will receive the same distribution of data over this same period of time. The limitation to this method is that the assumption of matching distributions across all pixels in the camera may not always be correct and in order to further reduce the likelihood of error, the amount of time the data is collected and analyzed may be extended. This can result in the detector being unreliable for several minutes or more while sufficient data is collected to allow the algorithms employed therein to compensate for these offsets.

One example of a physical solution employed in the past is the implementation of a physical shutter installed within the detector allowing a uniform view which can reveal offsets in the camera's pixels. While this is a highly accurate method in determining and accounting for offsets, it involves introducing a moving part into a system that has to be sealed for dirt, debris, and other intrusions, such as moisture. Further, as many of these systems are often installed on high altitude aircraft, a high temperature fluctuation is often experienced by the camera which can further contribute to a higher maintenance cost and a higher probability of failure. In such sensitive systems, even the slightest failure can reduce the reliability and/or accuracy of the offset calculations. For example, when using a physical the shutter, it is assumed that the shutter is completely closed and sealed, providing a 100 percent uniform surface for the camera to view to determine the offsets. However, even the smallest gap or inclusion in the shutter may result in pixel readings that are due to an outside factor and not due solely to offsets introduced by that particular power on cycle. Thus, the likelihood for mechanical failure and/or the possibility of unknown introduced error, coupled with the additional maintenance requirement, make physical shutters less desirable in non-laboratory settings or in situations where these cameras are expected to have long-term repeated use.

SUMMARY

The present disclosure addresses these and other issues by providing a reliable method for determining and addressing non-uniformity in an MCT detector-based IR focal plane sensor utilizing an IR light emitting diode (LED) to wash out environmental IR radiation providing an instantaneous single snapshot allowing the IR sensor account for offsets therein.

In one aspect, an exemplary embodiment of the present disclosure may provide an infrared (IR) sensor comprising: a front window operable to allow environmental IR light to pass therethrough; at least one optical lens defining an optical path behind the front window; an IR light emitting diode (LED) set apart from the optical path and behind the front window, wherein the IR LED is operable to project LED IR light into the optical path; and a focal plane array (FPA) operable to detect environmental IR light and LED IR light. This exemplary embodiment or another exemplary embodiment may further provide wherein the FPA is a mercury-cadmium-telluride camera. This exemplary embodiment or another exemplary embodiment may further provide wherein the LED IR light from the IR LED substantially washes out environmental IR light when the IR LED is powered on. This exemplary embodiment or another exemplary embodiment may further provide wherein the at least one optical lens further comprises a series of optical lenses operable to direct IR light through the optical path to the FPA. This exemplary embodiment or another exemplary embodiment may further provide wherein the LED IR light from the IR LED back propagates through the optical path via reflection off of the series of optics. This exemplary embodiment or another exemplary embodiment may further provide wherein the IR LED emits LED IR light in one of the short-wave IR (SWIR) atmospheric window, the mid-wave IR (MWIR) atmospheric window, and the long-wave IR (LWIR) atmospheric window and wherein the FPA is operable to detect IR light in the same atmospheric window. This exemplary embodiment or another exemplary embodiment may further provide wherein the IR LED emits LED IR light in more than one of the SWIR, MWIR, and LWIR atmospheric windows and wherein the FPA is operable to detect IR light in the same atmospheric windows.

In another aspect, an exemplary embodiment of the present disclosure may provide a method comprising: powering on an infrared (IR) sensor; turning on an IR light emitting diode (LED) set apart from an optical path within the IR sensor, the IR LED operable to project LED IR light into the optical path and to a focal plane array (FPA) within the IR sensor; detecting LED IR light from the IR LED on a plurality of pixels of the FPA; recording an image of the LED IR light from the IR LED via the FPA; calculating an offset for at least one pixel in the plurality of pixels and accounting therefor; turning off the IR LED; and operating the IR sensor normally. This exemplary embodiment or another exemplary embodiment may further provide wherein calculating the offset for at least one pixel and turning off the IR LED occurs simultaneously. This exemplary embodiment or another exemplary embodiment may further provide transmitting the recorded image from the FPA to a processor; wherein calculating an offset for at least one pixel in the plurality of pixels and accounting therefor is performed by the processor using the transmitted image. This exemplary embodiment or another exemplary embodiment may further provide wherein the FPA is a mercury-cadmium-telluride detector. This exemplary embodiment or another exemplary embodiment may further provide wherein the LED IR light from the IR LED substantially washes out any environmental IR light when the IR LED is powered on. This exemplary embodiment or another exemplary embodiment may further provide wherein the optical path includes at least one optical lens operable to direct IR light through the optical path to the FPA. This exemplary embodiment or another exemplary embodiment may further provide wherein the LED IR light from the IR LED back propagates through the optical path via reflection off of the at least one optical lens. This exemplary embodiment or another exemplary embodiment may further provide wherein the IR LED emits LED IR light in one of the short-wave IR (SWIR) atmospheric window, the mid-wave IR (MWIR) atmospheric window, and the long-wave IR (LWIR) atmospheric window and wherein the FPA is operable to detect IR light in the same atmospheric window. This exemplary embodiment or another exemplary embodiment may further provide wherein the IR LED emits LED IR light in more than one of the SWIR, MWIR, and LWIR atmospheric windows and wherein the FPA is operable to detect IR light in the same atmospheric windows. This exemplary embodiment or another exemplary embodiment may further provide: operating the IR sensor normally for a discrete period of time; and powering off the IR detector when the operation thereof is no longer desired. This exemplary embodiment or another exemplary embodiment may further provide: repeating the entire process each time the IR sensor is powered on.

In another aspect, an exemplary embodiment of the present disclosure may provide a method comprising: powering on an infrared (IR) sensor; turning on an IR light emitting diode (LED) set apart from an optical path within the IR sensor, the IR LED operable to wash out environmental IR light entering the IR sensor through a front window thereof; detecting LED IR light from the IR LED on a focal plane array (FPA) having a plurality of pixels within the IR sensor; recording an image of the LED IR light from the IR LED via the FPA; transmitting the recorded image to a processor from the FPA; calculating an offset for every pixel in the plurality of pixels and accounting therefor; turning off the IR LED; operating the IR sensor normally for a discrete period of time; and powering off the IR sensor. This exemplary embodiment or another exemplary embodiment may further provide: repeating the entire process each time the IR sensor is powered on.

BRIEF DESCRIPTION OF THE SEVERAL VIEWS OF THE DRAWINGS

Sample embodiments of the present disclosure are set forth in the following description, are shown in the drawings and are particularly and distinctly pointed out and set forth in the appended claims.

Similar numbers refer to similar parts throughout the drawings.

DETAILED DESCRIPTION

As used throughout herein, IR sensor, IR camera, and IR focal plane are understood to refer to IR focal plane sensor 10, unless specifically stated otherwise. Similarly, references to IR radiation, IR light, or IR wavelengths are generally understood to refer to any form of IR radiation, and may be considered synonymous for purposes of this disclosure, unless specifically stated otherwise.

Figure 1:
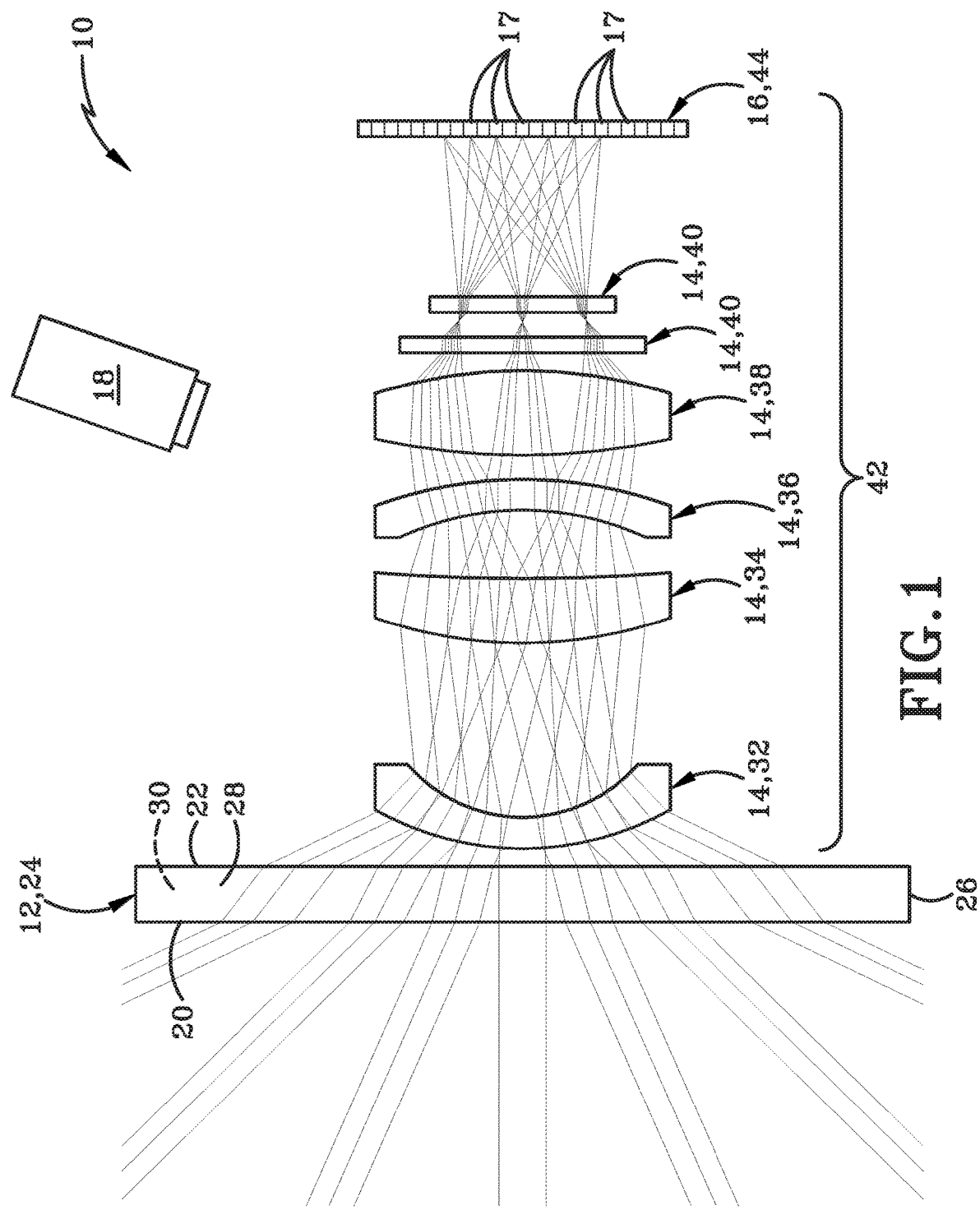
FIG. 1 is an overhead schematic view of an infrared sensor according to one aspect of the present disclosure in a normal operation mode.
Figure 2:
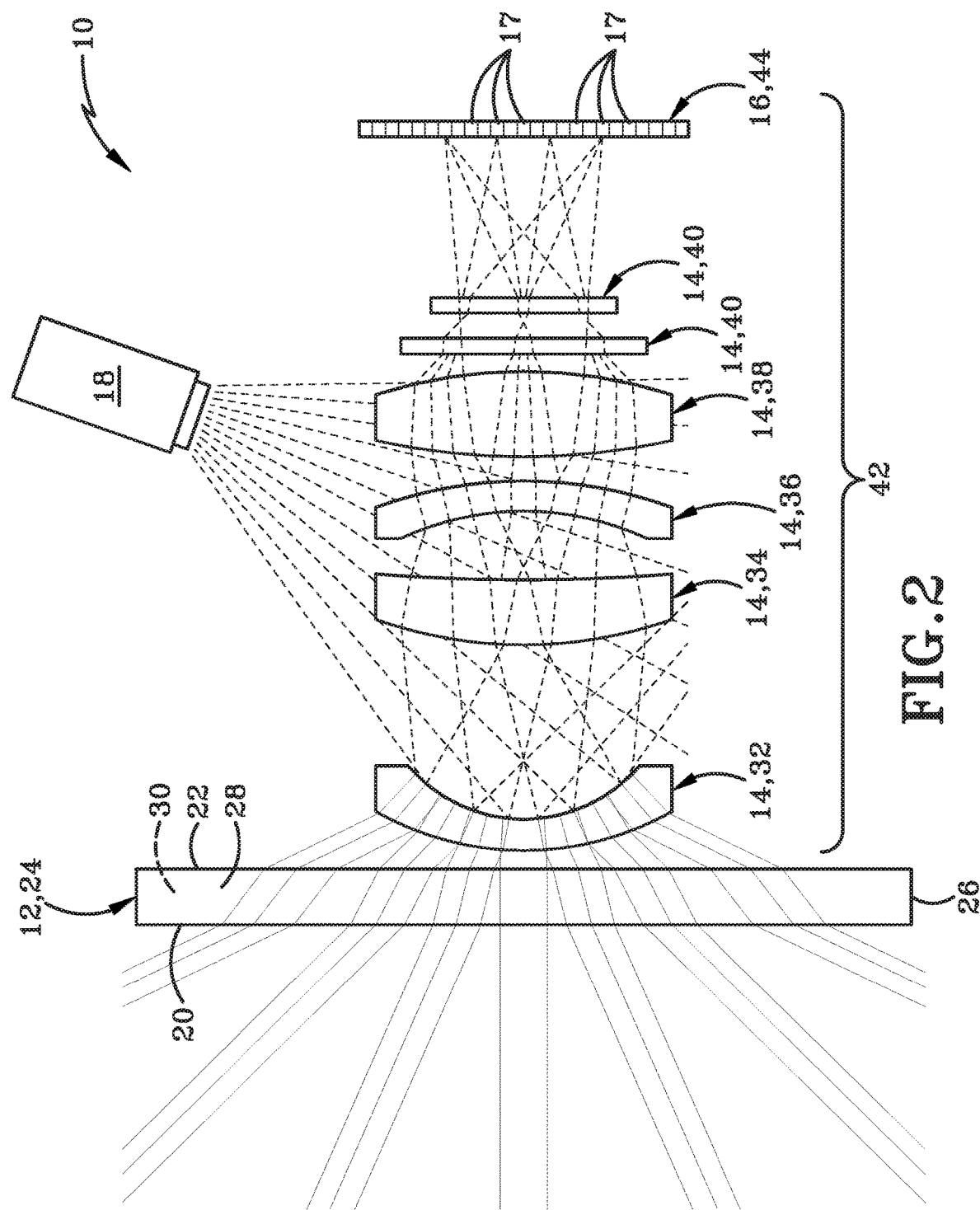
FIG. 2 is an overhead schematic view of the infrared sensor of FIG. 1 in a calibration mode.

With reference then to FIGS. 1 and 2, an infrared (IR) focal plane sensor, is shown and indicated generally at 10. IR sensor 10 may include a front window 12, one or more optics 14, a focal plane array 16, and IR light emitting diode (LED) 18. IR Sensor 10 may optionally include a body or housing (not shown) as discussed further herein.

Front window 12 may be a transparent or semitransparent material having a front side 20, a rear side 22, and a left side 24 when viewed from the front side 20, a right side 26, when viewed from the front side 20, a top side 28 and a bottom side 30. Front side 20 and rear side 22 may define a lateral direction therebetween further defining a thickness of front window 12. Left side 24 and right side 26 may define a transverse direction therebetween and top side 28 and bottom side 30 may define a vertical direction therebetween. Front window 12 may be configured to sit flush with a body or housing in which IR sensor 10 may be installed.

As discussed above, front window 12 may be transparent or semitransparent in that it may allow IR wavelengths to pass through freely without obstruction or distortion thereof. According to one aspect, front window 12 may be fabricated of optical glass, Plexiglas, or the like. According to another aspect, front window 12 may be fabricated out of a plastic or polymer that is permeable to IR wavelengths.

Optics 14 may be or include one or more optical lenses through which IR light may pass after it travels through front window 12 towards focal plane array 16 as discussed further herein. Optics 14 may therefore define an optical path 42, which is the path taken by IR light as it travels through IR sensor 10 from the front window 12 to the FPA 16, as discussed further herein. Optics 14 may be any standard optics of any shape as dictated by the implementation parameters. For example, optics 14 may be shaped as bi-convex, plano-convex, positive meniscus, negative meniscus, plano-concave, or bio-concave lenses. The specific order, orientation, arrangement, and/or type of optical lenses used for optics 14 may also vary depending upon the particular implementation and installation parameters of IR sensor 10.

According to one non-limiting example, as illustrated in FIGS. 1 and 2, optics 14 may be a series of lenses with the following order and orientation: a first negative meniscus lens 32; a plano-convex lens 34; a second negative meniscus lens 36 that is rotated 180° as compared to the first negative meniscus lens 32; and a bi-convex lens 38. Optics 14 may further include one or more converging lenses and/or diverging lens (collectively labeled as reference 40) to concentrate and/or spread the beams of IR light as they pass through optics 14 as further discussed herein.

Optics 14 may be of any shape suitable for the desired implementation. According tone example, optics 14 may be circular or semi-circular in shape. According to other examples, optics 14 may be rectangular, square, elliptical, or any other shape as dictated by the installation parameter. Optics 14 may each further have a thickness that may be dictated by the type of optic 14 (e.g. bi-convex, plano-convex, positive meniscus, negative meniscus, plano-concave, or bio-concave), by the distance between optics 14, and by the overall length of optical path 42, discussed further herein. Optics 14 may be fabricated or machined from materials having light permeable properties such as mirrored glass, optical grade glass, or any other suitable material. According to one aspect, different materials may be used for each individual optic 14 according to the desired effect on the IR light as it passes through each optic 14.

Focal plane array (FPA) 16 may be a standard FPA 16 having a plurality of individual pixels 17. Pixels 17 may be arranged in a pattern. According to one aspect, FPA 16 may be or include a grid of individual pixels 17 arranged in a square or rectangular pattern having one or more columns and/or rows of pixels 17 thereon. According to another aspect, FPA 16 may have a linear arrangement of pixels 17. The number and size of pixels 17 on the FPA 16 may vary depending on the desired implementation and installation parameters. For example, a larger IR sensor 10, such as those used in telescopes or observatories, may include a larger FPA 16 having a greater number of pixels 17 whereas a smaller IR sensor 10, such as those used in night vision goggles or on an aircraft, may be equipped with a smaller FPA 16 having a fewer number of pixels 17 thereon.

FPA 16 may be placed at the termination of the optical path 42 behind the final optic 14 such that IR light waves terminate at or on the pixels 17 of FPA 16 for most efficient detection thereof.

As it will be understood further herein, FPA 16 may be operationally connected to a computer or processor including a one or more non-transitory storage mediums and one or more microprocessors or logics capable of carrying out and executing a set of instructions or processes encoded thereon, as further discussed herein. According to one aspect, FPA 16 may be operationally connected to a computer or processor that is carried on, with, or as a part of IR sensor 10. According to another aspect, a computer or processor may be remote from IR sensor 10 such that FPA 16 and/or IR sensor 10 may be in wired or wireless communication therewith. The connectivity and communication between FPA 16 and/or IR sensor 10 with an associated computer or processor may therefore vary depending upon the desired implementation and installation parameters of IR sensor 10.

FPA 16 has thus far been generally described herein. While FPA 16 may be any type of IR sensor that is operable to detect IR radiation, it is further contemplated that FPA 16 may be a Mercury-Cadmium-Telluride (MCT) camera. MCT cameras are commonly used in military applications as they are capable of detecting IR radiation in all accessible atmospheric windows, including short-wave infrared (SWIR), mid-wave infrared (MWIR), and long-wave infrared (LWIR) windows, making them very valuable in military applications. Another benefit of MCT cameras is that the ratios of Cadmium to the Mercury and Telluride within in the MCT detector may be adjusted to increase sensitivity to IR radiation in a certain atmospheric window for specific applications as desired. Further, MCT cameras have high quantum efficiency at all wavelengths, defined as the percentage of IR photons hitting the pixels 17 of FPA 16 that produce charge carriers. These charge carriers are the electrical signals that can be sent to and interpreted by the computer or processor to determine the presence and quality metrics of the IR light hitting the pixels 17 of FPA 16. The high quantum efficiency of MCT cameras further increases their value in many applications, including military use.

While all IR cameras tend to suffer from non-uniformity of pixels introduced at each power-on cycle (herein referred to as offsets), MCT cameras are particularly prone to offset errors due to their unique properties and sensitivities. Accordingly, the pixels 17 of FPA 16, being an MCT camera, may give inaccurate readings upon power up due to offsets present in pixels 17. These offsets tend to manifest themselves as variations across neighboring pixels. By way of one non-limiting example, two adjacent pixels (numbered 1 and 2 for purposes of this example) pointed at an identical light source should have identical or nearly identical readings. If pixel 1, however, suffers from a power on offset, it may give a reading that is different from pixel 2. So if the known intensity of the light source, for example, is rated as a 50 on a scale from 1-100, both pixel 1 and pixel 2 should read at a 50. If pixel 1 reads at 50 and pixel 2 reads at 60, pixel 2 may have an offset of 10. Thus, for this particular usage cycle, defined as the time the sensor is in use beginning at power-on and terminating at power-off, all readings from pixel 2 should be reduced by 10. Further according to this example, the next time the system is powered on, the offsets must again be determined and accounted for as these offsets are not static and are known to change with each instance of powering on an IR focal plane sensor. These offsets and the accounting therefor is discussed further with regards to the operation of IR sensor 10, below.

IR sensor 10 may further include an IR LED 18 which can be an LED capable of emitting light in one or more infrared wavelengths. According to the desired implementation, the primary determining factor of what type of LED (i.e., what range of wavelengths the LED emits) is determined by the pixels 17 of FPA 16 being used within IR sensor 10. Specifically, the IR LED 18 should be compatible with FPA 16 such that FPA 16 is readily and easily capable of detecting the wavelengths emitted from IR LED 18.

IR LED 18 may be set apart from the optical path 42 such that IR LED 18 may introduce IR light into optical path 42 at an angle thereto. The specific angle of IR LED 18 relative to optical path 42 may be adjusted, however, it is contemplated that the IR LED 18 should not be placed at a right, or 90 degree, angle to optical path 42 as this would cause light emitted from IR LED 18 (referred to herein as LED IR light) to pass straight through optical path 42. According to one aspect, it may be permissible to have IR LED 18 placed at an angle less than 90 degrees from the optical path 42 (measured along optical path 42 from front window 12 to FPA 16). However, according to another aspect, it is preferable to have LED IR light from IR LED 18 directed into optical path 42 from the rear side of optics 14 (i.e. at an angle greater than 90 degrees), as discussed further herein. Therefore, placement of IR LED 18 relative to optical path 42 is contemplated to be set apart therefrom and angled rearward thereto, as seen in FIGS. 1 and 2.

According to one aspect, IR LED 18 may be placed to the side of optical path 42. According to another aspect, IR LED 18 may be placed above or below optical path 42. According to another aspect, IR LED 18 may be placed at any position around optical path 42 provided it is not at a right angle thereto and is oriented in a manner to permit LED IR light therefrom to be directed into the optical path 42, as discussed further herein.

Although not shown, IR sensor 10 may further have a body or housing containing all components therein. According to one aspect, the body or housing may be cylindrical or semi-cylindrical, thereby resembling or having the appearance of a camera lens or telescope. According to another aspect, the body or housing may be square or rectangular in shape. According to another aspect, the body or housing may be formed as a portion of, or as a cavity defined within the body or fuselage of an associated vehicle or aircraft. According to another aspect, IR sensor 10 may be installed and carried as a separate structure on a vehicle or aircraft as further discussed herein.

Accordingly, having thus described the structure and components of IR sensor 10, a method of operation and use will now be discussed.

With reference to FIG. 1, IR sensor 10 is shown in what will be referred to as a normal operation mode wherein background or environmental IR light (illustrated in FIGS. 1 and 2 as a solid line) is admitted through front window 12 and into optical path 42. As used herein, background or environmental IR light is the IR radiation emitted the object(s) at which IR sensor 10 is pointed, i.e. the object being detected. As the environmental IR light enters through front window 12, it encounters optics 14 which further direct the environmental IR light down optical path 42 to FPA 16. As IR light travels along optical path 42 and through optics 14, individual beams of IR light may converge or diverge depending upon the specific optics 14 employed within optical path 42 of IR sensor 10.

With reference to FIG. 2, IR sensor 10 is shown in what will be referred to as a power-on or calibration mode wherein IR LED 18 is turned on as well. In this mode, IR sensor 10 is operating normally, however, light from IR LED 18 (indicated in FIG. 2 as a dashed line) is shown entering optical path 42 from the side, at a slightly rearward angle, thereby washing out the environmental IR light passing through front window 12. As discussed above, IR LED 18 may be placed to the side of optical path 42, but at a slightly rearward angle to allow LED IR light therefrom to strike optics 14 and back propagate through optical path 42 and to FPA 16. The close proximity of IR LED 18 to optical path 42 and optics 14 causes the LED IR light from IR LED 18 to be brighter than, and thereby wash out, any environmental IR light entering optical path 42 through front window 12. Further, LED IR light from IR LED 18 may strike the back of optics 14 and reflect randomly through optical path 42 to FPA 16. Thus, the entire optical path 42 may be flooded with LED IR light from IR LED 18. As LED IR light from IR LED 18 then reflects back through optics 14, it can become more organized and directed by each of the optics 14 to the FPA 16. Although shown in FIG. 2 as a series of dashed lines, LED IR light from IR LED 18 is understood to fill the optical path 42 and strike the FPA 16 across all pixels 17. Optics 14 further organize LED IR light such that all pixels 17 may be illuminated by LED IR light within optical path 42, regardless of the source and intensity.

As LED IR light from the IR LED 18 reaches FPA 16, a snapshot image of the LED IR light may be taken, which can then be used to calculate and account for offsets within pixels 17 of FPA 16, as discussed further herein. Once this snapshot image is taken, IR LED 18 may be switched off, and IR sensor 10 may continue to operate normally, with environmental IR light entering through front window 12 and traveling down optical path 42 to FPA 16, as depicted in FIG. 1

Figure 3:
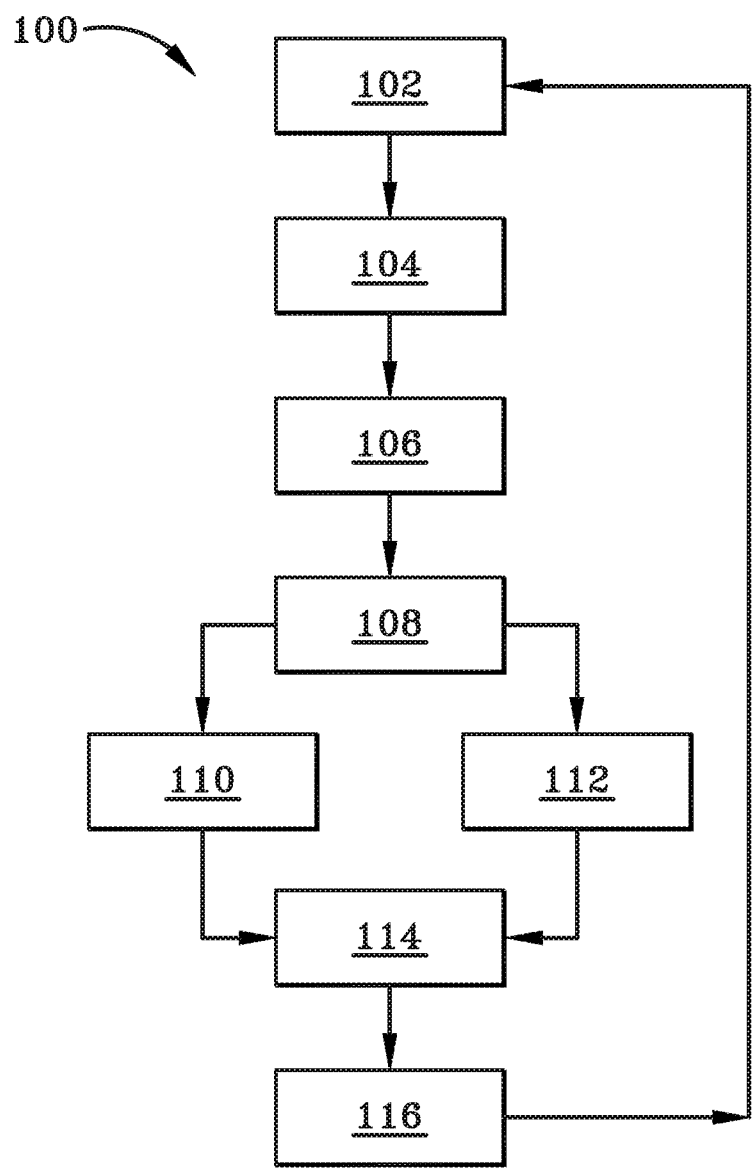
FIG. 3 is a flow chart depicting a method of use for the IR sensor according to one aspect of the present disclosure.

With reference to FIG. 3, a method of use for the present disclosure is illustrated by way of an operational flowchart. The method, hereinafter process 100, at its most basic form, is a process 100 for calibrating an IR sensor 10 to account for non-uniformity (i.e. offsets) that arise as a result of powering on IR focal plane sensors, such as IR sensor 10. By way of a simplified, non-limiting example, process 100 can be generally described as a process for "zeroing" the scales prior to normal operation. As it related specifically to IR sensor 10, the "scales" are the individual pixels 17 of FPA 16, and process 100 "zeroes" the pixels 17 by providing data to calculate existing offsets introduced by powering on IR sensor 10 and accounting for these offsets by removing them from subsequent data.

Accordingly, process 100 may begin with powering on the IR sensor 10, shown in the FIG. 3 as step 102. Each time the IR sensor 10 is powered on 102, the IR LED 18 may also be turned on 104. Turning on 104 the IR LED 18 may occur simultaneously with or shortly after powering on 102 IR sensor 10.

One aspect of MCT cameras is that to ensure proper operation, they must be cooled to a temperature near that of liquid nitrogen (approximately 77K). If not cooled, the pixel values may be unreliable and/or invalid. Thus, where FPA 16 is an MCT camera, the pixels 17 of FPA 16 would need to be cooled prior to operation thereof. This cooling may occur before IR sensor 10 is powered on (step 102), or may be done between powering on 102 IR sensor 10 and turning on IR LED 18 in step 104.

Turning on the IR LED 18 may allow LED IR light to shine into optical path 42 where it may reflect randomly off of optics 14 before being directed to FPA 16 and generating detectable values thereon. The placement of IR LED 18 to the side of the optical path 42, as discussed herein, may provide that the LED IR light striking the FPA 16 closest to the IR LED 18 may be more intense, i.e. brighter. Further, as the IR LED 18 washes out any natural environmental IR light (as shown in FIG. 2), the FPA 16 is expected to see a random, but smooth distribution across the pixels 17 as discussed further herein. Accordingly, the next step in process 100 is that of detecting LED IR light 106 from the IR LED 18. A snapshot image of the LED IR light from IR LED 18 may then be taken as step 108. This snapshot may be a single image or a series of images taken in rapid succession and may provide data to a computer or processor in communication with FPA 16 and/or IR sensor 10.

This data may then be analyzed in step 110 to calculate any offsets present within the pixels 17 or FPA 16 for this particular power-on cycle. Analyzation 110 of the data from the snapshot taken in step 108 is discussed further herein with reference to FIGS. 4 and 5.

While analysis of the data is occurring in step 110, IR LED 18 may be turned off, shown as step 112. According to one aspect, IR LED 18 may be switched off immediately after taking the snapshot in step 108, but at any time before step 114, which is the normal operation of IR sensor 10. According to another aspect, turning off 112 IR LED 18 may occur simultaneously with analyzing the data in step 110. Similarly, data analyzation 110 may occur at any time after taking the snapshot image in step 108, but prior to normal operation of IR sensor 10 in step 114. Once the data has been analyzed in step 110, IR sensor 10 may then be operated normally during step 114.

Normal operation 114 of IR sensor 10 may take place over an indiscriminate period of time equal to the desired length of operation according to the installation parameters and specifics of use. For example, if IR sensor 10 is installed on an aircraft, step 114, the normal operation thereof, may coincide with the entire length of the mission flight of the aircraft on which IR sensor 10 is installed.

According to aspect, IR sensor 10 may be operated for a set period of time determined by the specific installation parameters. For example, it may be desirable to train IR sensor 10 at a specific target for a specific period of time, to collect as much IR light through front window 12 as possible. This is common in telescope-type application. Then according to this example, the normal operation in step 114 may occur of a period of hours, days, or even weeks.

Therefore, once IR sensor 10 is no longer desired to be in active operation in step 114, it may be powered off as step 116, thus completing one cycle of process 100, which may be understood to constitute a single, complete power-up through power-down cycle of IR sensor 10. Therefore, at every subsequent powering on (step 102) of IR sensor 10, each step of process 100 may then be repeated to account for new offsets that may be introduced into pixels 17 of FPA 16 as a result of performing power-on step 102.

Figure 4:
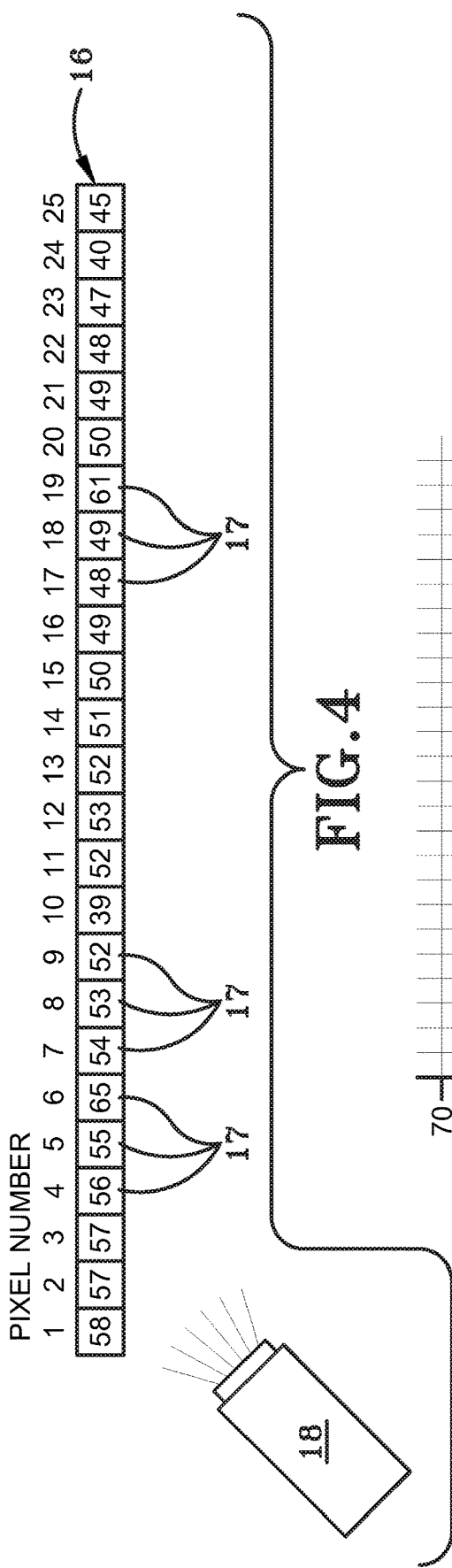
FIG. 4 is a front schematic view of an exemplary embodiment of a focal plane array according to one aspect of the present disclosure.

With reference now to FIG. 4, in operation, the power-up through power down cycle, shown as process 100 in FIG. 3, of IR sensor 10 may best be illustrated according to the following simplified, non-limiting example. For purposes of this example, an FPA 16 that is an MCT camera may have twenty-five (25) pixels 17 arranged in a linear pattern, as illustrated in FIG. 4. These pixels 17 may be numbered 1 through 25 starting with the pixel closest to IR LED 18. Now, when IR sensor 10 and IR LED 18 are powered on (steps 102 and 104, respectively), LED IR light from IR LED 18 may enter the optical path 42 as discussed herein and then reflect off of optics 14 back to FPA 16. LED IR light from IR LED 18 may illuminate each pixel 17 of FPA 16 causing each pixel 17 to register an individual value correlating to a specific quality of the LED IR light from IR LED 18. For this example, the quality being measured may be intensity of the IR light as it strikes each individual pixel 17, which may be represented as a positive integer.

To further illustrate this concept, arbitrary values have been assigned to each pixel 17, 1 through 25, as shown in FIG. 4. As may be expected, pixels 17 nearest the IR LED 18 may register slightly higher intensity as these pixels 17 are situated closer to the IR LED 18 and the LED IR light therefrom has less chance and distance to diffuse as it passes through optics 14. Additionally, any environmental IR light that does make it through optical path 42 and to FPA 16 is effectively washed out by LED IR light from IR LED 18 such the pixels 17 are illuminated with a smooth variation and distribution of LED IR light across the face of FPA 16 because even though each individual pixel 17 may vary in intensity, the IR LED 18 is close enough and bright enough that these variations should be minor. This wash out of environmental IR light effectively provides the FPA 16 a uniform view, from which the offsets may be calculated as singular pixel 17 deviations from the expected smooth variation distribution may indicate an offset present at that individual pixel 17. The distribution of LED IR light on the pixels 17 of FPA 16 may be detected in step 106 of process 100, while a snapshot image of this distribution may be taken in step 108 of process 100 for analysis and calculation of offsets (step 110), as described below. Once the snapshot image has been taken, IR LED 18 may be turned off (step 112).

Figure 5:
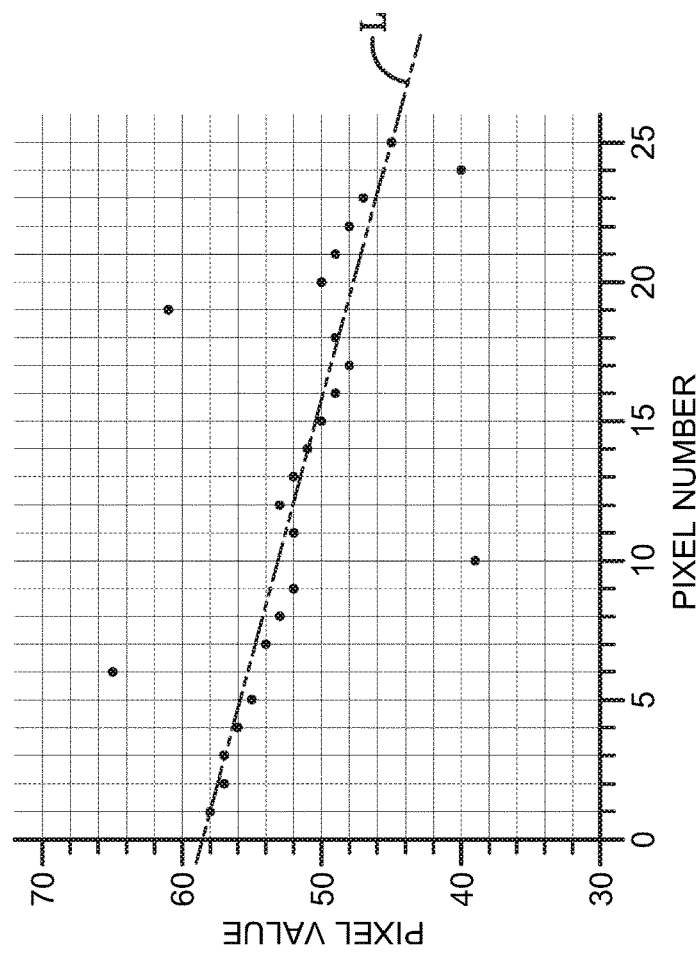
FIG. 5 is a graphical representation of the exemplary pixel data from FIG. 4 in accordance with to one aspect of the present disclosure.

The concept of calculating offsets (data analyzation in step 110) is more easily illustrated then by way of the graphical representation in FIG. 5. As shown in FIG. 5, the x-axis indicates each individual pixel 17 number 1 through 25 from FIG. 4 while the y-axis represents the recorded pixel value. As can be seen, plotting each pixel value relative to the pixel 17 number shows a generally smooth if somewhat slightly declining intensity across the face of our exemplary FPA 16 with a few pixel values deviating from the smooth fit. Specifically, line shown in the graph may represent a best fit line to the data presented, i.e. a line where approximately half of the values will be above the line and half will be below the line. Using line as a reference, it is therefore clear that most of the pixel vales for each pixel 17 are close to the line, with pixel numbers six (6), ten (10), nineteen (19), and twenty-four (24) deviating from line by a larger amount. These deviations are likely representative of offsets and may be corrected.

In continuing with the same example as illustrated in FIGS. 4 and 5, the variation across the face of the FPA 16 may then be calculated using standard processes or algorithms including any number of standard offset compensation algorithms. According to one embodiment, a process may be employed to compute the least squares fit to the best fit line 'L' drawn through the data points. Further according to this embodiment, depending on the requisite level of accuracy dictated by the implementation parameters, the data may be further processed using one or more of these standard offset compensation algorithms. For installations requiring high accuracy and reliability, every pixel 17 value may be calculated to determine the least squares fit to line 'L' and then adjusted thereto as an offset. This approach of adjusting every pixel to line 'L' accounts for even the smallest offsets, however, the tradeoff being additional processing time and/or resources devoted to eliminating offsets.

According to another aspect, where some minor variation is permissible within a system, only values that are statistically significantly different from the expected variation may be adjusted as offsets. According to this aspect, the four previously identified pixels, numbers 6, 10, 19, and 24, and perhaps a few others, but not all pixels, might need be adjusted, saving both processing time and resources, but at the cost of increased potential for error in the final results.

By way of one non-limiting example, in military applications where the IR sensor 10 is a targeting camera, variation may be undesirable and every value may be adjusted to fit the line. According to another non-limiting example where IR sensor 10 is implemented in an astronomical telescope, some variations may be permissible thereby requiring less adjustment to a least squares fit line.

As discussed herein, it is understood that the act of accounting for offsets within IR sensor 10 may employ known algorithms that adjust camera data delivered from the FPA 16 to a computer or processor before giving a final resulting image. For example, a single pixel 17 may have an offset calculated to a value of (+10). According to this example, for the duration of the power-on cycle of IR sensor 10, all data from that particular pixel 17 may be adjusted by an amount equal to the offset value (i.e. subtract a value of 10 from each data provided by that particular pixel) prior to displaying or otherwise providing an image result.

It will be understood that FPA 16 may be a grid having multiple rows and columns of pixels 17 which may introduce a third spatial element of relative location between the pixels 17 that may need to be accounted for when calculating offsets in the pixels 17. However, these grid-style arrangements pixels 17 of an FPA 16 are common and most standard offset compensation algorithms are equipped for use with such grid patterns and are able to account for offsets across the face of FPA 16 with pixels 17 of any arrangement.

According to another aspect, the number and relative arrangement of pixels 17 in FPA 16 may vary depending upon particular implementation parameters. However, it is likewise understood that standard offset compensation algorithms may be employed to account for offsets regardless of the number and/or arrangement of pixels 17.

A number of elements and aspects discussed herein may vary depending upon the specific implementation of IR sensor 10. For example, as discussed above, shape, size, and pixel 17 arrangement of FPA 16 may vary, as may the tolerance for variation between pixels, depending upon the implementation parameters. In that regard, in an effort to further describe IR sensor 10, the following non-limiting example may be offered: According to one aspect, IR sensor 10 may be installed in the fuselage of an aircraft, such as a manned reconnaissance aircraft. According to this example, front window 12 may be integrated into and/or flush with a panel of the fuselage of the aircraft and may allow infrared light to pass therethrough and into optical path 42. In use, when the aircraft carrying IR sensor 10 is anticipated to operate IR sensor 10 on a flight mission, IR sensor 10 may be powered on along with IR LED 18 such that LED IR light from IR LED 18 floods into optical path 42 and back propagates through optical path 42 to FPA 16 washing out environmental IR light. This may thereby allow a computer or processor to calculate and account for offsets between the pixels 17 within FPA 16 according to the methods described herein.

Once the data is collected and the offsets are calculated, IR LED 18 may be powered off while IR sensor 10 may then be operated normally throughout the flight mission. Normal operation then may involve collecting IR light in varying wavelengths and/or from varying sources simultaneously or in succession, then filtering these IR wavelengths through optics 14 and down optical path 42, terminating at FPA 16 where they illuminate pixels 17 of FPA 16 and thereby generate an electrical signal from the FPA 16 to a computer or processor. The computer or processor may then execute one or more standard offset compensation algorithms to calculate and account for offsets due to the power-on cycle of the IR sensor 10.

In the course of its mission, as the exemplary aircraft moves through its environment, sources and wavelengths of IR light may vary and change while IR sensor 10 may continue to collect and record data regarding these IR light sources and wavelengths. When the exemplary aircraft completes its mission and/or it is no longer desirable to operate IR sensor 10, IR sensor 10 may be shut off and may remain in a powered-off condition until it is desirable to reactivate IR sensor 10. At that point, IR sensor 10 may again be powered on, which may reset the power-on cycle, thus again resulting in the need to turn on IR LED 18 and to calibrate and account for offsets within IR sensor 10 and FPA 16 according to the methods described herein.

According to one aspect, process 100 may be repeated in part throughout the course of a power-on cycle. This may allow multiple snapshot images to be taken during a single power-on cycle. The data from these multiple snapshots may be aggregated and further used to increase the statistical significance of the results, or to adjust for any potential drift of the offsets over time. For example, when the IR sensor 10 is first powered on, process 100 may be performed as discussed above. Then, at a later time, but during normal operation (step 114) of IR sensor 10, steps 104 through 112 may be repeated to provide additional snapshots. Specifically, while in normal operation 114, IR LED 18 may be briefly turned on (step 104), thus washing out environmental IR light. As FPA 16 detects (step 106) the LED IR light from IR LED 18, a snapshot image may be taken (step 108) and analyzed (step 110) and IR LED 18 may be turned off (step 112) and normal operation 114 may resume. IR LED 18 need only be turned on for a very brief period of time, thus the normal operation of IR sensor 10 is only interrupted momentarily, and the overall effect on normal operation is minimal. To a human eye, the time elapsed from turning on of IR LED 18 (step 104) to turning off IR LED 18 (step 112) may appear to happen in an instant, similar to the flash of a camera bulb.

Although disclosed herein as being placed to the side of optical path 42, IR LED 18 may be placed to the side or any other position around optical path 42 as dictated by the installation parameters. For example, in an installation where IR LED 18 will not physically fit to the side of optical path 42, it may be placed above or below optical path 42 or at an angle therebetween. The placement of IR LED 18 may therefore be dictated by the installation conditions and may vary in position while maintaining the same relative function.

It is further understood that while the systems described herein, particularly IR sensor 10 and FPA 16, are contemplated as MCT detectors, other IR detectors are known to have similar offset issues of varying degrees depending upon the materials used therein and other detectors may likewise benefit from the IR LED 18 use and operation as described herein.

It is also understood that exemplary embodiments disclosed herein are non-limiting examples as the specific configuration of elements, particularly optics 14 and FPA 16 as well as front window 12 and IR LED 18, may vary depending upon the materials and/or installation requirements of IR sensor 10.

It is further contemplated that the systems and methods provided herein are compatible with standard offset compensation algorithms and processes by providing data for these algorithms to utilize in compensating for offsets inherent in such systems relative to the detector. Accordingly, the present methods and systems are not limited to any one particular mathematical operation or process to account for and remove offsets detected through the methods provided herein.

Various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments can be implemented in any of numerous ways. For example, embodiments of technology disclosed herein may be implemented using hardware, software, or a combination thereof. When implemented in software, the software code or instructions can be executed on any suitable processor or collection of processors, whether provided in a single computer or distributed among multiple computers. Furthermore, the instructions or software code can be stored in at least one non-transitory computer readable storage medium.

Also, a computer or smartphone utilized to execute the software code or instructions via its processors may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible format.

Such computers or smartphones may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

The various methods or processes outlined herein may be coded as software/instructions that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, various inventive concepts may be embodied as a computer readable storage medium (or multiple computer readable storage media) (e.g., a computer memory, one or more floppy discs, compact discs, optical discs, magnetic tapes, flash memories, USB flash drives, SD cards, circuit configurations in Field Programmable Gate Arrays or other semiconductor devices, or other non-transitory medium or tangible computer storage medium) encoded with one or more programs that, when executed on one or more computers or other processors, perform methods that implement the various embodiments of the disclosure discussed above. The computer readable medium or media can be transportable, such that the program or programs stored thereon can be loaded onto one or more different computers or other processors to implement various aspects of the present disclosure as discussed above.

The terms "program" or "software" or "instructions" are used herein in a generic sense to refer to any type of computer code or set of computer-executable instructions that can be employed to program a computer or other processor to implement various aspects of embodiments as discussed above. Additionally, it should be appreciated that according to one aspect, one or more computer programs that when executed perform methods of the present disclosure need not reside on a single computer or processor, but may be distributed in a modular fashion amongst a number of different computers or processors to implement various aspects of the present disclosure.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

All definitions, as defined and used herein, should be understood to control over dictionary definitions, definitions in documents incorporated by reference, and/or ordinary meanings of the defined terms.

"Logic", as used herein, includes but is not limited to hardware, firmware, software and/or combinations of each to perform a function(s) or an action(s), and/or to cause a function or action from another logic, method, and/or system. For example, based on a desired application or needs, logic may include a software controlled microprocessor, discrete logic like a processor (e.g., microprocessor), an application specific integrated circuit (ASIC), a programmed logic device, a memory device containing instructions, an electric device having a memory, or the like. Logic may include one or more gates, combinations of gates, or other circuit components. Logic may also be fully embodied as software. Where multiple logics are described, it may be possible to incorporate the multiple logics into one physical logic. Similarly, where a single logic is described, it may be possible to distribute that single logic between multiple physical logics.

Furthermore, the logic(s) presented herein for accomplishing various methods of this system may be directed towards improvements in existing computer-centric or internet-centric technology that may not have previous analog versions. The logic(s) may provide specific functionality directly related to structure that addresses and resolves some problems identified herein. The logic(s) may also provide significantly more advantages to solve these problems by providing an exemplary inventive concept as specific logic structure and concordant functionality of the method and system. Furthermore, the logic(s) may also provide specific computer implemented rules that improve on existing technological processes. The logic(s) provided herein extends beyond merely gathering data, analyzing the information, and displaying the results. Further, portions or all of the present disclosure may rely on underlying equations that are derived from the specific arrangement of the equipment or components as recited herein. Thus, portions of the present disclosure as it relates to the specific arrangement of the components are not directed to abstract ideas. Furthermore, the present disclosure and the appended claims present teachings that involve more than performance of well-understood, routine, and conventional activities previously known to the industry. In some of the method or process of the present disclosure, which may incorporate some aspects of natural phenomenon, the process or method steps are additional features that are new and useful.

The articles "a" and "an," as used herein in the specification and in the claims, unless clearly indicated to the contrary, should be understood to mean "at least one." The phrase "and/or," as used herein in the specification and in the claims (if at all), should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc. As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

When a feature or element is herein referred to as being "on" another feature or element, it can be directly on the other feature or element or intervening features and/or elements may also be present. In contrast, when a feature or element is referred to as being "directly on" another feature or element, there are no intervening features or elements present. It will also be understood that, when a feature or element is referred to as being "connected", "attached" or "coupled" to another feature or element, it can be directly connected, attached or coupled to the other feature or element or intervening features or elements may be present. In contrast, when a feature or element is referred to as being "directly connected", "directly attached" or "directly coupled" to another feature or element, there are no intervening features or elements present. Although described or shown with respect to one embodiment, the features and elements so described or shown can apply to other embodiments. It will also be appreciated by those of skill in the art that references to a structure or feature that is disposed "adjacent" another feature may have portions that overlap or underlie the adjacent feature.

Spatially relative terms, such as "under", "below", "lower", "over", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if a device in the figures is inverted, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly. Similarly, the terms "upwardly", "downwardly", "vertical", "horizontal", "lateral" and the like are used herein for the purpose of explanation only unless specifically indicated otherwise.

Although the terms "first" and "second" may be used herein to describe various features/elements, these features/elements should not be limited by these terms, unless the context indicates otherwise. These terms may be used to distinguish one feature/element from another feature/element. Thus, a first feature/element discussed herein could be termed a second feature/element, and similarly, a second feature/element discussed herein could be termed a first feature/element without departing from the teachings of the present invention.

An embodiment is an implementation or example of the present disclosure. Reference in the specification to "an embodiment," "one embodiment," "some embodiments," "one particular embodiment," "an exemplary embodiment," or "other embodiments," or the like, means that a particular feature, structure, or characteristic described in connection with the embodiments is included in at least some embodiments, but not necessarily all embodiments, of the invention. The various appearances "an embodiment," "one embodiment," "some embodiments," "one particular embodiment," "an exemplary embodiment," or "other embodiments," or the like, are not necessarily all referring to the same embodiments.

If this specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

As used herein in the specification and claims, including as used in the examples and unless otherwise expressly specified, all numbers may be read as if prefaced by the word "about" or "approximately," even if the term does not expressly appear. The phrase "about" or "approximately" may be used when describing magnitude and/or position to indicate that the value and/or position described is within a reasonable expected range of values and/or positions. For example, a numeric value may have a value that is +/−0.1% of the stated value (or range of values), +/−1% of the stated value (or range of values), +/−2% of the stated value (or range of values), +/−5% of the stated value (or range of values), +/−10% of the stated value (or range of values), etc. Any numerical range recited herein is intended to include all sub-ranges subsumed therein.

Additionally, the method of performing the present disclosure may occur in a sequence different than those described herein. Accordingly, no sequence of the method should be read as a limitation unless explicitly stated. It is recognizable that performing some of the steps of the method in a different order could achieve a similar result.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures.

In the foregoing description, certain terms have been used for brevity, clearness, and understanding. No unnecessary limitations are to be implied therefrom beyond the requirement of the prior art because such terms are used for descriptive purposes and are intended to be broadly construed.

Moreover, the description and illustration of various embodiments of the disclosure are examples and the disclosure is not limited to the exact details shown or described.

What is claimed is:

1. An infrared (IR) sensor comprising:
   a front window operable to allow environmental IR light to pass therethrough;
   at least one optical lens defining an optical path behind the front window;
   an IR light emitting diode (LED) set apart from the optical path and behind the front window, wherein the IR LED is operable to project LED IR light into the optical path;
   a focal plane array (FPA) operable to detect environmental IR light and LED IR light; and
   a processor operationally connected to the FPA, wherein the processor is configured to calculate an offset and account for the offset for at least one pixel in a plurality of pixels of the FPA.

2. The IR sensor of claim 1 wherein the FPA is a mercury-cadmium-telluride camera.

3. The IR sensor of claim 1 wherein the LED IR light from the IR LED substantially washes out environmental IR light when the IR LED is powered on.

4. The IR sensor of claim 3 wherein the at least one optical lens further comprises a series of optical lenses operable to direct IR light through the optical path to the FPA.

5. The IR sensor of claim 4 wherein the LED IR light from the IR LED back propagates through the optical path via reflection off of the series of optics.

6. The IR sensor of claim 3 wherein the IR LED emits LED IR light in one of the short-wave IR (SWIR) atmospheric window, the mid-wave IR (MWIR) atmospheric window, and the long-wave IR (LWIR) atmospheric window and wherein the FPA is operable to detect IR light in the same atmospheric window.

7. The IR sensor of claim 6 wherein the IR LED emits LED IR light in more than one of the SWIR, MWIR, and LWIR atmospheric windows and wherein the FPA is operable to detect IR light in the same atmospheric windows.

8. A method comprising:
   powering on an infrared (IR) sensor;
   turning on an IR light emitting diode (LED) set apart from an optical path within the IR sensor, the IR LED operable to project LED IR light into the optical path and to a focal plane array (FPA) within the IR sensor;

detecting LED IR light from the IR LED on a plurality of pixels of the FPA;

recording an image of the LED IR light from the IR LED via the FPA;

calculating an offset for at least one pixel in the plurality of pixels and accounting therefor;

turning off the IR LED; and operating the IR sensor normally.

9. The method of claim 8 wherein calculating the offset for at least one pixel and turning off the IR LED occurs simultaneously.

10. The method of claim 8 further comprising:

transmitting the recorded image from the FPA to a processor;

wherein calculating an offset for at least one pixel in the plurality of pixels and accounting therefor is performed by the processor using the transmitted image.

11. The method of claim 8 wherein the FPA is a mercury-cadmium-telluride detector.

12. The method of claim 8 wherein the LED IR light from the IR LED substantially washes out any environmental IR light when the IR LED is powered on.

13. The method of claim 12 wherein the optical path includes at least one optical lens operable to direct IR light through the optical path to the FPA.

14. The method of claim 13 wherein the LED IR light from the IR LED back propagates through the optical path via reflection off of the at least one optical lens.

15. The method of claim 8 wherein the IR LED emits LED IR light in one of the short-wave IR (SWIR) atmospheric window, the mid-wave IR (MWIR) atmospheric window, and the long-wave IR (LWIR) atmospheric window and wherein the FPA is operable to detect IR light in the same atmospheric window.

16. The method of claim 15 wherein the IR LED emits LED IR light in more than one of the SWIR, MWIR, and LWIR atmospheric windows and wherein the FPA is operable to detect IR light in the same atmospheric windows.

17. The method of claim 8 further comprising:

operating the IR sensor normally for a discrete period of time; and powering off the IR detector when the operation thereof is no longer desired.

18. The method of claim 17 further comprising:

repeating the entire process each time the IR sensor is powered on.

19. A method comprising:

powering on an infrared (IR) sensor;

turning on an IR light emitting diode (LED) set apart from an optical path within the IR sensor, the IR LED operable to wash out environmental IR light entering the IR sensor through a front window thereof;

detecting LED IR light from the IR LED on a focal plane array (FPA) having a plurality of pixels within the IR sensor;

recording an image of the LED IR light from the IR LED via the FPA;

transmitting the recorded image to a processor from the FPA;

calculating an offset for every pixel in the plurality of pixels and accounting therefor;

turning off the IR LED;

operating the IR sensor normally for a discrete period of time; and powering off the IR sensor.

20. The method of claim 19 further comprising:

repeating the entire process each time the IR sensor is powered on.

* * * * *